(12) United States Patent
Feldman-Peabody et al.

(10) Patent No.: US 9,306,105 B2
(45) Date of Patent: Apr. 5, 2016

(54) FINGER STRUCTURES PROTRUDING FROM ABSORBER LAYER FOR IMPROVED SOLAR CELL BACK CONTACT

(71) Applicant: First Solar Malaysia Sdn. Bhd., Kulim (MY)

(72) Inventors: Scott Daniel Feldman-Peabody, Golden, CO (US); Mark Jeffrey Pavol, Arvada, CO (US); Robert Dwayne Gossman, Aurora, CO (US); Bogdan Lita, Boulder, CO (US); Nathan John Kruse, Arvada, CO (US); John Milton Flood, III, Monument, CO (US); Valerie Pflumio Hill, Denver, CO (US)

(73) Assignee: First Solar Malaysia Sdn. Bhd., Kulim, Kodah Darul Aman (MY)

( * ) Notice: Subject to any disclaimer, the term of this patent is extended or adjusted under 35 U.S.C. 154(b) by 40 days.

(21) Appl. No.: 13/955,348

(22) Filed: Jul. 31, 2013

(65) Prior Publication Data

US 2015/0034154 A1 Feb. 5, 2015

(51) Int. Cl.
*H01L 31/073* (2012.01)
*H01L 31/0224* (2006.01)
*H01L 31/18* (2006.01)
(Continued)

(52) U.S. Cl.
CPC ...... *H01L 31/073* (2013.01); *H01L 31/022425* (2013.01); *H01L 31/035281* (2013.01); *H01L 31/0445* (2014.12); *H01L 31/1836* (2013.01)

(58) Field of Classification Search
CPC ............ H01L 31/0272; H01L 31/0224; H01L 31/022425; H01L 31/035281; H01L 31/0445; H01L 31/073
See application file for complete search history.

(56) References Cited

U.S. PATENT DOCUMENTS 5,501,744 A * 3/1996 Albright et al. ............... 136/258
5,557,146 A 9/1996 Britt et al.
2006/0024947 A1 2/2006 Clements et al.
(Continued)

FOREIGN PATENT DOCUMENTS

EP 1433207 B1 8/2009
EP 2333844 A2 6/2011
(Continued)

OTHER PUBLICATIONS

PCT International Search Report and Written Opinion, Application No. PCT/US2014/049077 dated Nov. 17, 2014.

*Primary Examiner* — Jennifer Michener
*Assistant Examiner* — Bethany L Martin
(74) *Attorney, Agent, or Firm* — MacMillan, Sobanski and Todd, LLC

(57) ABSTRACT

Thin film photovoltaic devices that include a transparent substrate; a transparent conductive oxide layer on the transparent substrate; a n-type window layer on the transparent conductive oxide layer; a p-type absorber layer on the n-type window layer; and, a back contact on the p-type absorber layer are provided. The p-type absorber layer comprises cadmium telluride, and forms a photovoltaic junction with the n-type window layer. Generally, the p-type absorber layer defines a plurality of finger structures protruding from the p-type absorber layer into the back contact. The finger structures can have an aspect ratio of about 1 or greater and/or can have a height that is about 20% to about 200% of the thickness of the p-type absorber layer. Methods of forming such finger structures protruding from a back surface of the p-type absorber layer are also provided.

12 Claims, 2 Drawing Sheets

(51) Int. Cl.
*H01L 31/0352* (2006.01)
*H01L 31/0445* (2014.01)

(56) References Cited

U.S. PATENT DOCUMENTS

| | | |
|---|---|---|
| 2010/0184249 A1 | 7/2010 | Chen |
| 2010/0212731 A1 | 8/2010 | Abken |
| 2010/0243039 A1* | 9/2010 | Korevaar et al. ............ 136/255 |
| 2010/0261304 A1 | 10/2010 | Chang |
| 2011/0139235 A1* | 6/2011 | Gossman et al. ............ 136/256 |
| 2011/0143489 A1 | 6/2011 | Korevaar |
| 2011/0143490 A1 | 6/2011 | O'Keefe |
| 2011/0209763 A1 | 9/2011 | Cho |
| 2011/0259423 A1 | 10/2011 | Korevaar et al. |
| 2012/0061235 A1* | 3/2012 | Feldman-Peabody .... B22F 3/02 204/192.1 |
| 2012/0192933 A1 | 8/2012 | Steltenpool et al. |
| 2012/0322198 A1 | 12/2012 | Kobyakov et al. |
| 2013/0115372 A1 | 5/2013 | Pavol et al. |

FOREIGN PATENT DOCUMENTS

| | | |
|---|---|---|
| EP | 2337084 A2 | 6/2011 |
| EP | 2337088 A2 | 6/2011 |
| EP | 2337091 A2 | 6/2011 |
| WO | WO2007129097 A2 | 11/2007 |
| WO | WO2010099047 A1 | 9/2010 |

* cited by examiner

FINGER STRUCTURES PROTRUDING FROM ABSORBER LAYER FOR IMPROVED SOLAR CELL BACK CONTACT

FIELD OF THE INVENTION

The subject matter disclosed herein relates generally to improving the electrical contact between an absorber layer including cadmium telluride and a back contact layer. Specifically, the subject matter disclosed is related to the presence of finger structures protruding from the absorber layer into the back contact layer.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type absorber layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type absorber layer (i.e., an electron accepting layer) and the CdS layer acts as an n-type layer (i.e., an electron donating layer).

A transparent conductive oxide ("TCO") layer is commonly used between the window glass and the junction forming layers. This TCO layer provides the front electrical contact on one side of the device and is used to collect and carry the electrical charge produced by the cell. Conversely, a back contact layer is provided on the opposite side of the junction forming layers and is used as the opposite contact of the cell. This back contact layer is adjacent to the p-type absorber layer, such as the cadmium telluride layer in a CdTe PV device.

However, metal electrodes can make a poor contact with the p-type layer, especially when the p-type layer includes cadmium telluride. This contact problem can lead to significantly reduced energy conversion efficiency in the device, and can lead to an increased rate of deterioration of the device.

Thus, a need exists for photovoltaic devices having improved energy conversion efficiency and/or device lifetime through improved contact between the back contact and the p-type layer, particularly when the p-type layer includes cadmium telluride.

BRIEF DESCRIPTION OF THE INVENTION

Aspects and advantages of the invention will be set forth in part in the following description, or may be obvious from the description, or may be learned through practice of the invention.

Thin film photovoltaic devices are generally provided that include a transparent substrate; a transparent conductive oxide layer on the transparent substrate; a n-type window layer on the transparent conductive oxide layer; a p-type absorber layer on the n-type window layer; and, a back contact on the p-type absorber layer. The p-type absorber layer comprises cadmium telluride, and forms a photovoltaic junction with the n-type window layer. Generally, the p-type absorber layer defines a plurality of finger structures protruding from the p-type absorber layer into the back contact.

In one embodiment, the finger structures have an aspect ratio of about 1 or greater (e.g., about 3 or greater, such as about 3 to about 7). In one embodiment, the finger structures have a height that is about 20% to about 200% of the thickness of the p-type absorber layer (e.g, about 50% to about 150%). For example, a majority of the finger structures can, in certain embodiments, have a protruding height of about 1.5 µm to about 5 µm (e.g., about 2 µm to about 4 µm). In one particular embodiment, the plurality of finger structures have a density of about 0.1 to about 100 finger structures per 100 square micrometers on the back surface defined by the p-type absorber layer and adjacent to the back contact.

Methods are also generally provided for forming an electrical contact between a photovoltaic junction and a back contact. In one embodiment, a source material (e.g, cadmium telluride) is sublimated into source vapors, which are deposited onto a substrate, such as via diffusive transport deposition. The source vapors are generally deposited onto the substrate in an atmosphere consisting essentially of oxygen to form a p-type absorber layer on the substrate. A back contact can then be formed on the p-type absorber layer.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
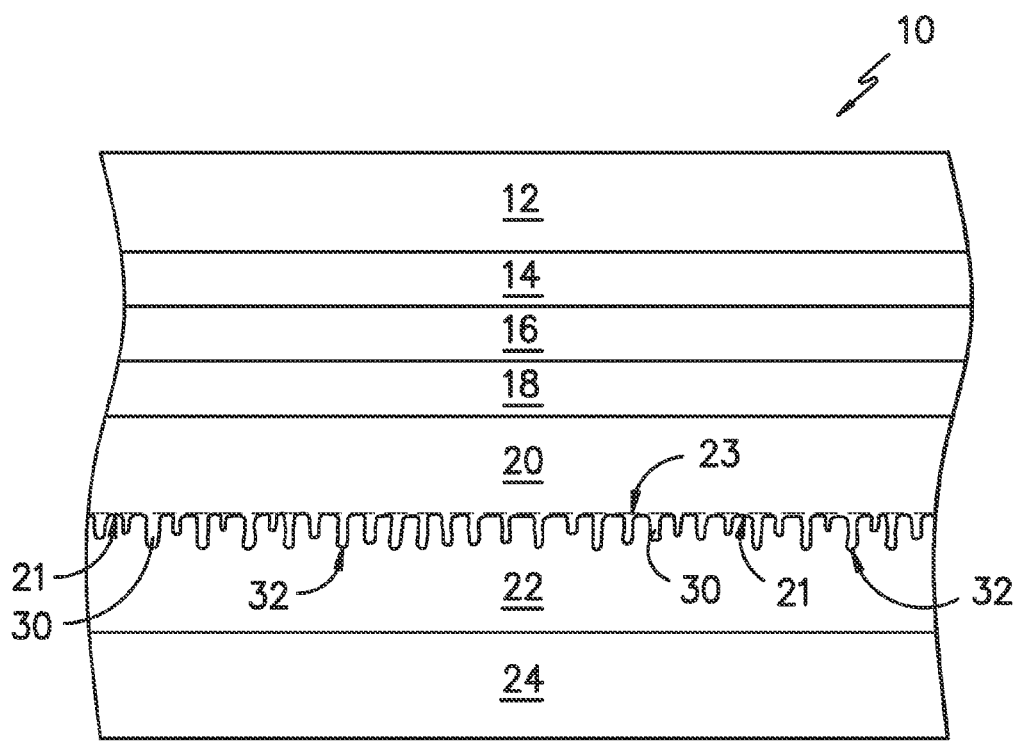
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

Thin film photovoltaic devices are generally provided having a plurality of finger structures protruding from the p-type absorber layer into the back contact, along with their methods of manufacture. In particular, the finger structures can be utilized between the p-type absorber layer (e.g., a cadmium telluride layer) of the thin film PV device and the back contact layer(s). In one embodiment, the finger structures can generally provide improved electrical contact between the p-type absorber layer of a cadmium telluride based thin film PV device and the back electrical contact. Although the present disclosure is generally directed to cadmium telluride based thin film photovoltaic devices, it is to be understood that the anisotropic conductive layer can be utilized in any PV device as the back contact or as part of the back contact.

FIG. 1 shows a cross-section of an exemplary cadmium telluride based thin-film photovoltaic device 10. The device 10 is shown including a glass substrate 12, a transparent conductive oxide (TCO) layer 14, a resistive transparent buffer layer 16, a n-type window layer 18 (e.g., comprising cadmium sulfide), a p-type absorber layer 20 (e.g., comprising cadmium telluride) defining a plurality of finger structures 30, a back contact 22, and an encapsulation substrate 24. The n-type layer 18 and the p-type absorber layer 20 generally form a p-n junction in the device 10.

The plurality of finger structures 30 protrude from the p-type absorber layer 20 and into the back contact 22. A majority of the finger structures 30 generally define an aspect ratio that about 1 or greater, such as about 3 or greater (e.g., about 3 to about 7), with the "aspect ratio" defined by its height in the z-direction (i.e., the distance in the z-direction from the back surface plane 23 to the peak 32 of the finger structure 30) divided by its greatest diameter in the x,y plane (the y-axis is perpendicular to both the x-axis and the z-axis shown in FIG. 1). That is, in one embodiment, a majority of the finger structures 30 have a height that is at least about three times its greatest diameter (e.g., about 3 to about 7 times its greatest diameter).

In one embodiment, the height of the peak structures 30 (i.e., the distance in the z-direction from the back surface plane 23 to the peak 32 of the finger structure 30) can be proportional to the thickness of the p-type absorber layer 20 (i.e., the distance in the z-direction from the back surface plane 23 to the opposite surface of the p-type absorber layer 20 at the n-type window layer 18). For example, the finger structures 30 can have a height that is about 20% to about 200% of the thickness of the p-type absorber layer 20, such as about 50% to about 150%. For instance, if the p-type absorber layer 20 has a thickness of about 3 µm to about 4 µm, then a majority of the finger structures 30 can have a protruding height of about 1.5 µm to about 5 µm (e.g., about 2 µm to about 4 µm).

The plurality of finger structures 30 protruding from the p-type absorber layer 20 significantly increases the surface area present on the p-type absorber layer 20 adjacent to the back contact 22 that would otherwise be defined by a substantially flat thin film layer. Without wishing to be bound by any particular theory, it is believed that the finger structures 30 contributes to lower series resistance for the device 10, which leads to higher efficiency. The relatively high surface area may also improve uptake during copper doping as well as aid in cadmium chloride dosing. That is, during copper treatment (or another surface treatment), the p-type absorber layer 20 has a larger surface area such that the finger structures 30 absorb dopants (e.g., $CdCl_2$ or Cu). Additionally, the finger structures 30 may also improve adhesion between the p-type absorber layer 20 and the back contact 22.

As stated, the p-type absorber layer 20 generally defines a back surface 21 adjacent to the back contact 22. In certain embodiments, the plurality of finger structures 30 have a density of about 0.1 to about 100 finger structures per 100 square micrometers (µm) on the back surface 21 defined by the p-type absorber layer 20, such as about 1 to about 10 finger structures per 100 square nm. In one embodiment, the plurality of finger structures 30 cover the entire back surface 21 of the p-type absorber layer 20. For example, the finger structures 30 can have a substantially uniform density covering the entire back surface 21 of the p-type absorber layer 20, although the pattern and individual fingers structures 30 would not be uniformly sized or spaced due to the formation method.

As shown, the back contact 22 is integrally positioned between the finger structures 30 so as to surround the finger structures 30 and fill the valleys defined therebetween. Thus, the interaction between the p-type absorber layer 20 and the back contact 22 can be maximized.

Figure 2:
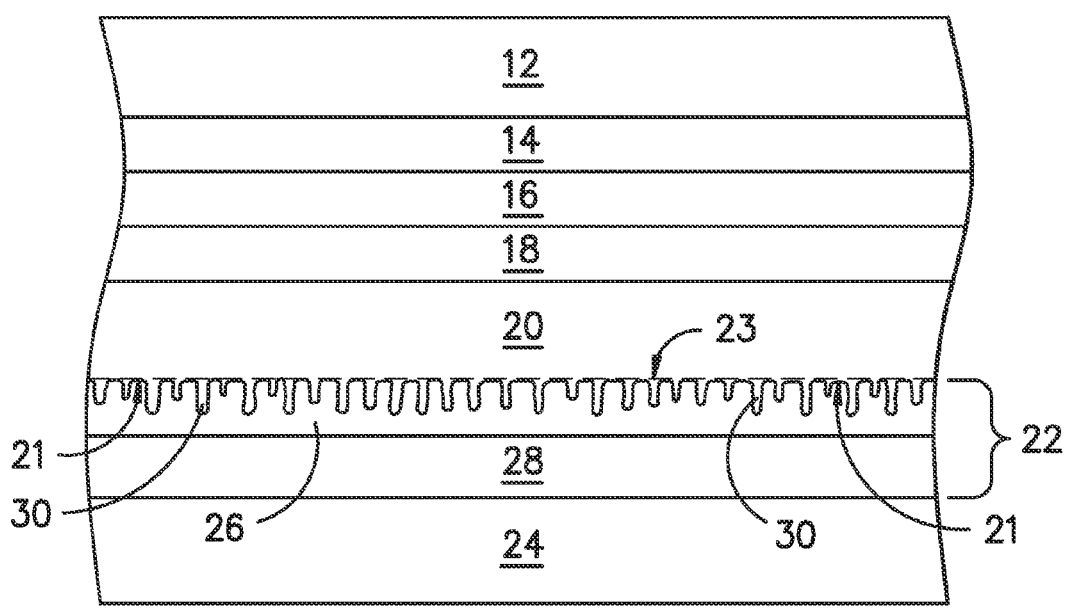
FIG. 2 shows another cross-sectional view of the exemplary cadmium telluride thin film photovoltaic device shown in FIG. 1; and, FIG. 3 shows a cross-sectional view of the exemplary cadmium telluride thin film photovoltaic device shown in FIG. 1.
Figure 3:
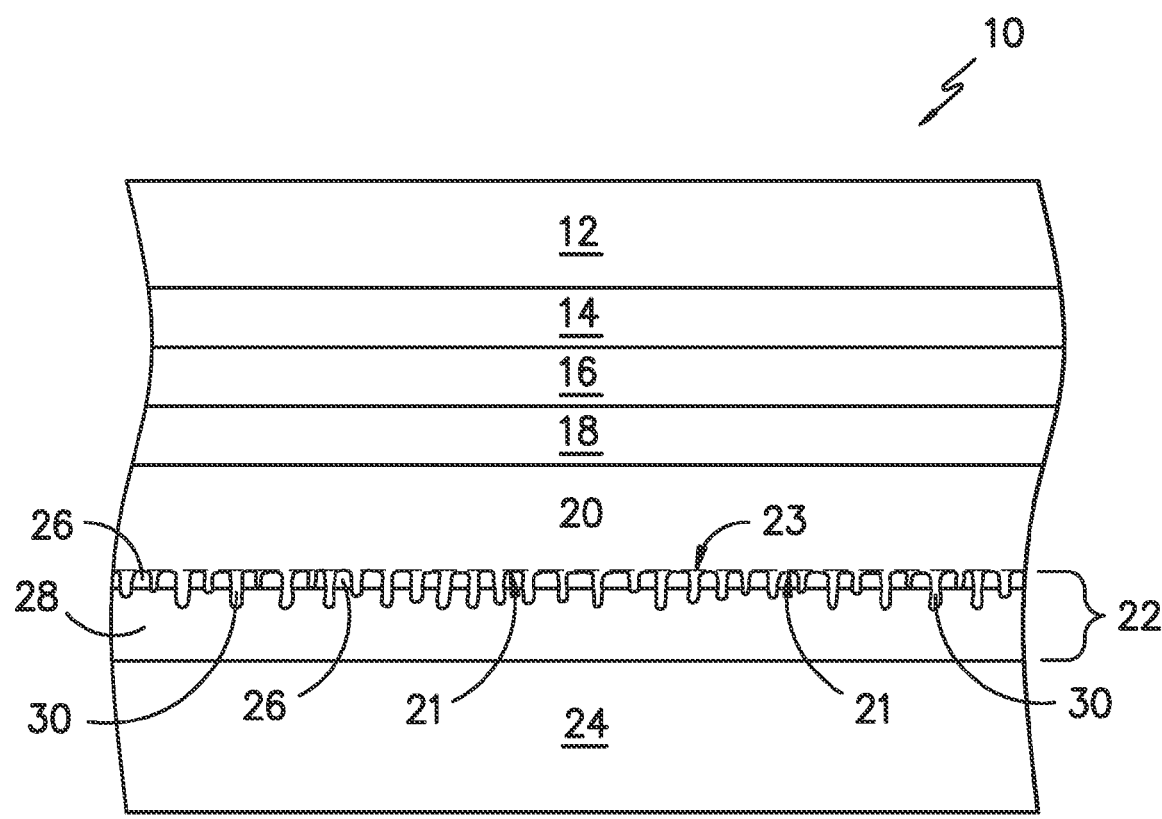

The back contact 22 in the embodiments of FIGS. 2 and 3 is formed from the optional conductive paste layer 26 (e.g., a graphite layer) and a metal contact layer 28, as is shown on the absorber layer 20. The back contact 22 generally serves as the opposite electrical contact, in relation to the TCO layer 14 serving as the front electrical contact. The back contact is formed on, and in one embodiment is in direct contact with, the surface 21 of the cadmium telluride layer 20. In FIG. 2, the finger structures 30 protrude from the p-type absorber layer 20 and into the conductive paste layer 26 of the back contact 22. In the embodiment of FIG. 3, the finger structures 30 protrude from the p-type absorber layer 20, through the conductive paste layer 26 of the back contact 22, and into the metal layer 28 of the back contact 22.

The finger structures 30 are generally formed during vapor deposition of the p-type absorber layer 20 on the n-type window layer 18 in a superstrate configuration. For example, the finger structures 30 are formed via close space sublimation of a CdTe based p-type absorber layer 20 in the presence of oxygen. In one particular embodiment, the finger structures 30 are formed via close space sublimation of the p-type absorber layer 20 in an atmosphere consisting essentially of oxygen (i.e., substantially free from any other gases). In one embodiment, the atmosphere (consisting essentially of oxygen) has a total pressure of about 100 mTorr to about 1 Torr. Without wishing to be bound by any particular theory, it is believed that the presence of oxygen affects the grow rate non-uniformly in the z-direction across the p-type absorber layer 20, causing faster growth in some areas than other areas resulting in formation of the finger structures 30.

Generally, the finger structures 30, and their methods of formation, can be used in any cadmium telluride thin film photovoltaic device 10, such as the exemplary device 10 shown in FIGS. 1-3. In one embodiment, the exemplary device 10 of FIGS. 1-3 includes a transparent substrate 12 of glass. In this embodiment, the glass 12 can be referred to as a "superstrate," since it is the substrate on which the subsequent layers are formed, but it faces upwards to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmission of about 90% or greater in the spectrum of interest (e.g., wavelengths from about 300 nm to about 900 nm).

The transparent conductive oxide (TCO) layer 14 is shown on the transparent substrate 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.45 μm. Suitable flat glass substrates having a TCO layer 14 formed on the superstrate surface can be purchased commercially from various glass manufactures and suppliers. For example, a particularly suitable glass 12 including a TCO layer 14 includes a glass commercially available under the name TEC 15 TCO from Pilkington North America Inc. (Toledo, Ohio), which includes a TCO layer having a sheet resistance of 15 ohms per square or less.

The resistive transparent buffer layer 16 (RTB layer) is shown on the TCO layer 14 on the exemplary cadmium telluride thin film photovoltaic device 10, and is an optional layer in the thin film stack of the device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the n-type window layer 18 (particularly when comprising cadmium sulfide) can allow for a relatively thin n-type window layer 18 to be included in the device 10 by reducing the possibility of interface defects (i.e., "pinholes" in the n-type window layer 18) creating shunts between the TCO layer 14 and the p-type absorber layer 20. Thus, it is believed that the RTB layer 16 allows for improved adhesion and/or interaction between the TCO layer 14 and the p-type absorber layer 20, thereby allowing a relatively thin n-type window layer 18 to be formed thereon without significant adverse effects that would otherwise result from such a relatively thin n-type window layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

The n-type window layer 18 is shown on resistive transparent buffer layer 16 of the exemplary device 10. In one embodiment, the n-type window layer 18 generally includes cadmium sulfide (CdS) but may also include other materials, such as zinc sulfide, cadmium zinc sulfide, etc., and mixtures thereof as well as dopants and other impurities (i.e., a cadmium sulfide layer). Such a cadmium sulfide layer may include oxygen up to about 25% by atomic percentage, for example from about 5% to about 20% by atomic percentage. The n-type window layer 18 can have a wide band gap (e.g., from about 2.25 eV to about 2.5 eV, such as about 2.4 eV) in order to allow most radiation energy (e.g., solar radiation) to pass. As such, the n-type window layer 18 is considered a transparent layer on the device 10.

The n-type window layer 18 can be formed by sputtering, chemical vapor deposition, chemical bath deposition, and other suitable deposition methods. In one particular embodiment, the n-type window layer 18 can be formed by sputtering, either direct current (DC) sputtering or radio frequency (RF) sputtering, on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the n-type window layer 18 can have a thickness that is less than about 0.1 µm, such as between about 10 nm and about 100 nm, such as from about 40 nm to about 80 nm, with a minimal presence of pinholes between the resistive transparent layer 16 and the n-type window layer 18. Additionally, a n-type window layer 18 having a thickness less than about 0.1 µm reduces any adsorption of radiation energy by the n-type window layer 18, effectively increasing the amount of radiation energy reaching the underlying p-type absorber layer 20.

The p-type absorber layer 20 is shown on the n-type window layer 18 in the exemplary cadmium telluride thin film photovoltaic device 10 of FIG. 1. As stated, the p-type absorber layer 20 generally includes cadmium telluride (CdTe) but may also include other materials (i.e., a cadmium telluride layer). The p-type absorber layer 20 of device 10 is the photovoltaic layer that interacts with the n-type window layer 18 (e.g., the cadmium sulfide layer) to produce current from the adsorption of radiation energy by absorbing the majority of the radiation energy passing into the device 10 due to its high absorption coefficient and creating electron-hole pairs. For example, the p-type absorber layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type absorber layer 20 across the junction to the n-type window layer 18 and, conversely, holes may pass from the n-type side to the p-type side. Thus, the p-n junction formed between the n-type window layer 18 and the p-type absorber layer 20 forms a diode in which the charge imbalance leads to the creation of an electric field spanning the p-n junction. Conventional current is allowed to flow in only one direction and separates the light induced electron-hole pairs.

In one particular embodiment, the n-type window layer 18 is deposited by a sputtering and the p-type absorber layer 20 is deposited by close-space sublimation (CSS) in an oxygen atmosphere to form the finger structures 30. In particular embodiments, the p-type absorber layer 20 can have a thickness between about 0.1 µm and about 10 µm, such as from about 1 µm and about 5 µm. In one particular embodiment, the p-type absorber layer 20 can have a thickness between about 2 µm and about 4 nm, such as about 3 nm.

CSS is a known commercial vapor deposition process for production of CdTe modules. Within the vapor deposition chamber in a CSS system, the substrate is brought to an opposed position at a relatively small distance (e.g., about 2-3 mm) opposite to a CdTe source. The CdTe material sublimes and deposits onto the surface of the substrate. The sublimated material moves through holes in a cover placed over the receptacle and deposits onto the stationary glass surface, which is held at the smallest possible distance (e.g., 1-2 mm) above the cover frame. It is understood that CSS is a type of diffusive transport deposition (DTD) system, and diffusive transport deposition systems, more broadly, need not necessarily qualify as "close spaced" in nature.

A series of post-forming treatments can be applied to the exposed surface of the p-type absorber layer 20. These treatments can tailor the functionality of the p-type absorber layer 20 and prepare its surface for subsequent adhesion to the back contact 22, particularly the conductive paste layer 26 when present. For example, the p-type absorber layer 20 can be annealed at elevated temperatures (e.g., from about 350° C. to about 500° C., such as from about 375° C. to about 424° C.) for a sufficient time (e.g., from about 1 to about 10 minutes) to create a quality p-type absorber layer of cadmium telluride. Without wishing to be bound by theory, it is believed that annealing the p-type absorber layer 20 (and the device 10) converts the weakly p-type p-type absorber layer 20 to a more strongly p-type cadmium telluride layer 20 having a relatively low resistivity. Additionally, the p-type absorber layer 20 can recrystallize and undergo grain growth during annealing.

Annealing the p-type absorber layer 20 can be carried out in the presence of cadmium chloride in order to dope the p-type absorber layer 20 with chloride ions. For example, the p-type absorber layer 20 can be washed with an aqueous solution containing cadmium chloride then annealed at the elevated temperature.

In one particular embodiment, after annealing the p-type absorber layer 20 in the presence of cadmium chloride, the surface can be washed to remove any cadmium oxide formed on the surface. This surface preparation can leave a Te-rich surface on the p-type absorber layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface. In one embodiment, the application of the treatment solution described above, and its subsequent annealing, can be performed after annealing the p-type absorber layer 20 in the presence of cadmium chloride and washing the surface 21.

As stated, the back contact 22 is formed from the conductive paste layer 26 and the metal contact layer 28 shown on the p-type absorber layer 20 and generally serves as the back electrical contact, in relation to the opposite, TCO layer 14 serving as the front electrical contact. The back contact is formed on, and in one embodiment is in direct contact with, the p-type absorber layer 20. The metal contact layer 28 is suitably made from one or more highly conductive materials, such as elemental nickel, chromium, copper, tin, aluminum, gold, silver, technetium or alloys or mixtures thereof. The metal contact layer 28, if made of or comprising one or more metals, is suitably applied by a technique such as sputtering or metal evaporation. The metal contact layer 28 can be from about 0.1 µm to about 1.5 µm in thickness.

Other layers may also be present in the thin film stack, although not specifically shown in the embodiment of FIGS. 1-3. For example, index matching layers may be present between the transparent conductive oxide layer 14 and the superstrate 12. Additionally, an oxygen getter layer may be present in the thin film stack, such as adjacent to the transparent conductive oxide layer 14 (e.g., between the transparent conductive oxide layer 14 and the optional resistive transparent buffer layer 16).

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells, as described above with respect to FIG. 1.

An encapsulating substrate 24 (e.g., a glass substrate) is laminated to the transparent substrate 12 to complete the device 10.

Methods for forming a photovoltaic device are also generally provided. For example, in one embodiment, the method can include forming, on a n-type window layer, a p-type absorber layer comprising cadmium telluride and having a plurality of finger structures thereon as discussed above. Then, a back contact layer on the p-type absorber layer as discussed above. Other steps may also be present in such a method, such as treatment of the p-type absorber layer as discussed above.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A thin film photovoltaic device, comprising:
    a transparent substrate;
    a transparent conductive oxide layer on the transparent substrate;
    a n-type window layer on the transparent conductive oxide layer;
    a p-type absorber layer on the n-type window layer, wherein the p-type absorber layer comprises cadmium telluride, and wherein the n-type window layer and the p-type absorber layer form a photovoltaic junction; and,
    a back contact on the p-type absorber layer,
    wherein the p-type absorber layer defines a plurality of finger structures protruding from the p-type absorber layer into the back contact, the finger structures comprising tellurium-rich cadmium telluride and having an aspect ratio of about 1 or greater; wherein the back contact comprises a conductive paste layer on the p-type absorber layer and a metal layer on the conductive paste layer; wherein the finger structures protrude through the conductive paste layer and directly contact the metal layer of the back contact.

2. The thin film photovoltaic device as in claim 1, wherein a majority of the finger structures have an aspect ratio of about 3 or greater.

3. The thin film photovoltaic device as in claim 1, wherein a majority of the finger structures have an aspect ratio of about 3 to about 7.

4. The thin film photovoltaic device as in claim 1, wherein the p-type absorber layer defines a thickness, and wherein the finger structures have a height that is about 20% to about 200% of the thickness of the p-type absorber layer.

5. The thin film photovoltaic device as in claim 4, wherein the finger structures have a height that is about 50% to about 150% of the thickness of the p-type absorber layer.

6. The thin film photovoltaic device as in claim 4, wherein a majority of the finger structures have a protruding height of about 1.5 µm to about 5 µm.

7. The thin film photovoltaic device as in claim 4, wherein a majority of the finger structures have a protruding height of about 2 µm to about 4 µm.

8. The thin film photovoltaic device as in claim 1, wherein the p-type absorber layer defines a back surface adjacent to the back contact, and wherein the plurality of finger structures have a density of about 0.1 to about 100 finger structures per 100 square micrometers on the back surface defined by the p-type absorber layer.

9. The thin film photovoltaic device as in claim 1, wherein the p-type absorber layer defines a back surface adjacent to the back contact, and wherein the plurality of finger structures have a density of about 1 to about 10 finger structures per 100 square micrometers on the back surface defined by the p-type absorber layer.

10. The thin film photovoltaic device as in claim 1, wherein the p-type absorber layer defines a back surface area adjacent to the back contact, wherein the plurality of finger structures cover the entire back surface of the p-type absorber layer.

11. The thin film photovoltaic device as in claim 9, wherein the plurality of finger structures have a substantially uniform density covering the entire back surface of the p-type absorber layer.

12. A thin film photovoltaic device, comprising:
    a transparent substrate;
    a transparent conductive oxide layer on the transparent substrate;
    a n-type window layer on the transparent conductive oxide layer;
    a p-type absorber layer on the n-type window layer, wherein the p-type absorber layer comprises cadmium telluride and defines a thickness, and wherein the n-type window layer and the p-type absorber layer form a photovoltaic junction; and,
    a back contact on the p-type absorber layer,
    wherein the p-type absorber layer defines a plurality of finger structures protruding from the p-type absorber layer into the back contact, wherein the finger structures comprise tellurium-rich cadmium telluride and have a height that is about 20% to about 200% of the thickness of the p-type absorber layer; wherein the back contact comprises a conductive paste layer on the p-type absorber layer and a metal layer on the conductive paste layer; wherein the finger structures protrude through the conductive paste layer and directly contact the metal layer of the back contact.

\* \* \* \* \*